(12) United States Patent
Yang

(10) Patent No.: US 7,286,731 B2
(45) Date of Patent: Oct. 23, 2007

(54) MONOLITHICALLY INTEGRATED OPTICAL COUPLER WITH SUBSTANTIALLY NO SPLITTING LOSS

(75) Inventor: Weiguo Yang, East Windsor, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 70 days.

(21) Appl. No.: 10/835,448

(22) Filed: Apr. 29, 2004

(65) Prior Publication Data

US 2005/0244100 A1    Nov. 3, 2005

(51) Int. Cl.
*G02B 6/26*    (2006.01)

(52) U.S. Cl. .................................. 385/27; 385/45

(58) Field of Classification Search ............ 385/45, 385/27, 46
See application file for complete search history.

(56) References Cited

U.S. PATENT DOCUMENTS

| | | | |
|---|---|---|---|
| 5,077,728 A * | 12/1991 | Kaminow | 398/89 |
| 5,127,081 A * | 6/1992 | Koren et al. | 385/130 |
| 5,134,672 A * | 7/1992 | Imoto et al. | 385/16 |
| 5,214,664 A * | 5/1993 | Paoli | 372/50.121 |
| 5,305,412 A * | 4/1994 | Paoli | 385/122 |
| 5,321,714 A * | 6/1994 | Paoli | 372/50.22 |
| 5,363,457 A | 11/1994 | Falt et al. | |
| 5,524,076 A * | 6/1996 | Rolland et al. | 385/8 |
| 5,799,119 A * | 8/1998 | Rolland et al. | 385/28 |
| 5,838,870 A * | 11/1998 | Soref | 385/131 |
| 5,930,031 A * | 7/1999 | Zhou et al. | 359/344 |
| 6,178,276 B1 * | 1/2001 | Mackie | 385/28 |
| 6,205,163 B1 * | 3/2001 | Hamamoto | 372/43.01 |
| 6,253,000 B1 * | 6/2001 | Madsen et al. | 385/16 |
| 6,571,038 B1 * | 5/2003 | Joyner et al. | 385/40 |
| 6,646,784 B2 * | 11/2003 | Leuthold | 359/332 |
| 2001/0028766 A1 * | 10/2001 | Hatami-Hanza | 385/47 |
| 2002/0097765 A1 * | 7/2002 | Marsh et al. | 372/50 |
| 2003/0067678 A1 * | 4/2003 | Shibata et al. | 359/344 |

OTHER PUBLICATIONS

S. S. Saini, et al., "Lossless 1×2 Optical Switch Monolithically Integrated on a Passive Active Resonant Coupler (PARC) Platform", IEEE Photonics Technology Letters, vol. 12, No. 7, Jul. 2000, pp. 840-842.

* cited by examiner

Primary Examiner—Ellen E. Kim

(57) ABSTRACT

A lossless optical coupler includes at least one input waveguide, at least two output waveguides and an intermediate optical splitter. The optical splitter of the present invention further comprises an active section adapted to provide contemporaneous splitting and amplification of an input optical signal. The arrangement of the present invention provides an inexpensive and compact integrateable coupling device.

15 Claims, 2 Drawing Sheets

MONOLITHICALLY INTEGRATED OPTICAL COUPLER WITH SUBSTANTIALLY NO SPLITTING LOSS

FIELD OF THE INVENTION

This invention relates to optical couplers and, more specifically, to integrated optical couplers having substantially no splitting loss.

BACKGROUND OF THE INVENTION

Optical couplers, such as mode couplers, are used extensively in integrated optics to split and to combine light signals propagating through an optical waveguide structure. Since an optical coupler splits an input into several outputs, each output will have less optical power than a corresponding input. This power drop is loosely termed as splitting loss. For example, a 1×2, 50-50 coupler has a 3-dB splitting loss beside other losses. This power drop or splitting loss fundamentally limits several useful system and device architectures that otherwise find many applications in electronic systems. For example, data bus architecture, which is ubiquitous in electronic computers and data networks, finds limited applications in optical systems mainly due to splitting losses. Filter designs based on finite or infinite impulse responses (FIR or IIR) also require a series of the splitting of an input signal. The applications in optics of such devices therefore are also limited due to splitting losses.

Current solutions for the splitting losses in conventional optical couplers include passive optical couplers having amplifiers at the inputs and/or the outputs to provide amplification for optical signals being split. However, the splitting and amplification of such optical couplers occur at different locations of the optical coupler and the transition between the active amplification process and the passive splitting require intricate and expensive manufacturing processes. In addition such optical couplers require a plurality of optical amplifiers and may comprise a relatively large form factor.

SUMMARY OF THE INVENTION

The present invention solves the deficiencies of the prior art by providing an inexpensive optical coupler having substantially no splitting loss and comprising a very small form factor.

In one embodiment of the present invention a lossless optical coupler includes at least one input waveguide, an optical splitter and at least two output waveguides. The optical splitter includes an active section adapted to provide contemporaneous splitting and amplification of an input optical signal. The optical splitter of the present invention may comprise an MMI coupler or may alternatively comprise a free space optical coupler such as a star coupler.

In an alternate embodiment of the present invention method for lossless optical coupling includes contemporaneous splitting and amplification of an input optical signal such that each component of the split optical signal comprises substantially the same optical power as the input optical signal.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Although various embodiments of the present invention are being depicted herein with respect to a 1×2 MMI optical coupler, the specific embodiments of the present invention should not be treated as limiting the scope of the invention. It will be appreciated by one skilled in the art informed by the teachings of the present invention that the concepts of the present invention may be applied in other optical couplers, such as star couplers, having substantially any number of input and output ports.

Figure 1:
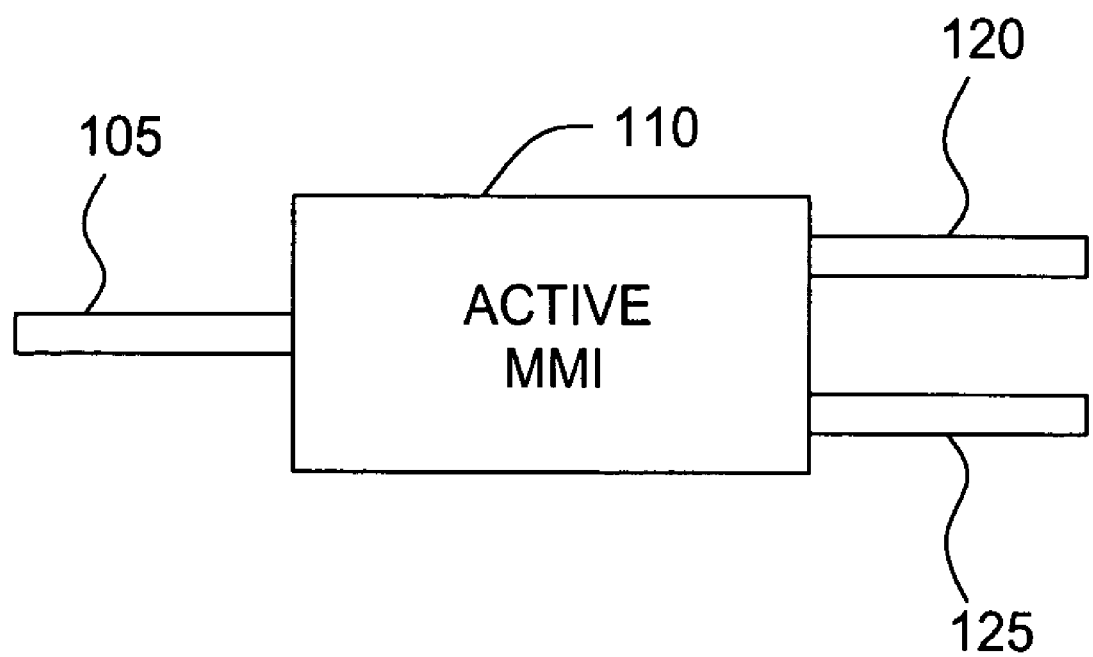
FIG. 1 depicts a high-level block diagram of an embodiment of a lossless active optical coupler in accordance with the present invention.

FIG. 1 depicts a high-level block diagram of an embodiment of a lossless active optical coupler in accordance with the present invention. The lossless optical coupler 100 of FIG. 1 illustratively comprises an MMI coupler 110, a single input waveguide 105 and two output waveguides 120, 125. In the optical coupler 100 of FIG. 1, the MMI coupler 110 comprises an active section such that the optical coupler 100 is capable of providing both splitting and amplification of an input optical signal. In the lossless optical coupler 100 of FIG. 1, the amplification and the splitting are accomplished at substantially the same location and at substantially the same time. Such a configuration provides a compact device that requires very few wire bonds. Although in the lossless optical coupler of FIG. 1, the coupler is depicted as an MMI coupler, other couplers, such as free space couplers including star couplers, may be implemented in place of the MMI coupler in accordance with the present invention.

Figure 2:
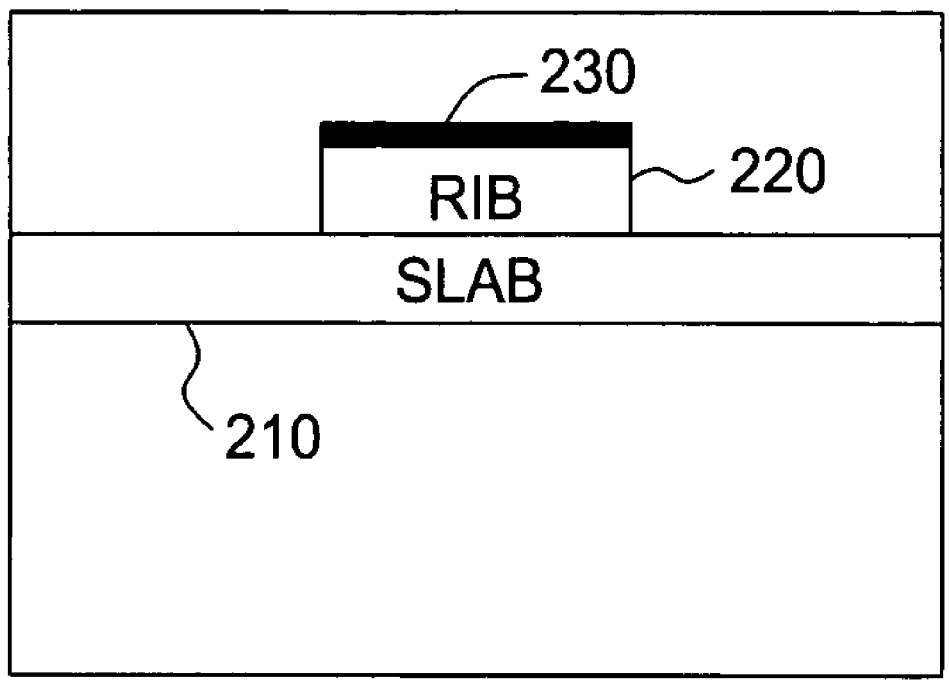
FIG. 2 depicts a high level block diagram of an embodiment of the waveguide structures of the lossless optical coupler of FIG. 1.

FIG. 2 depicts a high level block diagram of an embodiment of the waveguide structures of the lossless optical coupler 100 of FIG. 1. The active waveguide structure of the lossless optical coupler comprises a channel waveguide structure consisting of a slab layer 210, an index-loading rib layer 220 and an active layer 230. In operation, the active layer 230 has a bias current applied to it (not shown).

In an optical coupler in accordance with the present invention, such as the optical coupler 100 of FIG. 1, an optical signal is input via the input waveguide 105. The input optical signal is communicated to the MMI 110 wherein the optical power is distributed into different modes supported by the MMI 110 and refocused into the output waveguides 120 and 125 after propagating for a proper distance. During the propagation in the MMI 110, the optical power in each supported mode also induces the stimulated emission of injected carriers provided by the bias current applied to the active layer 230 (i.e., coherent amplification). The recombination of the coherently amplified optical power in each MMI supported mode with proper phase accumulation along the propagation results in the substantially simultaneous splitting and amplification of an input optical signal.

An optical coupler in accordance with the present invention, such as the optical coupler 100 of FIG. 1, may be integrated using active-passive monolithic integration (APMI) techniques. For example, according to one fabrication technique, a shallow etched buried rib structure is used for forming the passive waveguides of the optical coupler of the present invention. Such a technique provides record low propagation loss in InP material systems. An active section is then formed by another thin layer of multi-quantum-wells (MQW) directly on top of the rib which is buried by the same re-growth that forms passive waveguides. As such, the optical coupler of the present invention may be used as an active device and a passive device. For example, an optical signal input into the optical coupler is amplified in the active section of the optical coupler in addition to being split by the MMI coupler. Preferably, InP/InGaAsP is the material of choice for an optical coupler in accordance with the present invention because this material allows for monolithic integration with other active components such as transmitters, receivers, optical amplifiers and the like. In this form, multiple waveguides may be placed in close proximity to each other such that each waveguide may be optimized for a specific optical function (e.g. active waveguide optimized for gain, passive waveguide optimized for ease of coupling, passive waveguide optimized for splitting, directional coupling or other passive devices).

Even further, an optical coupler in accordance with the present invention is capable of active-passive monolithic integration (APMI) using other techniques known in the art. For example, an optical coupler in accordance with the present invention may comprise optoelectronic integrated waveguide devices utilizing a tilted valence band quantum well semiconductor double hetero-structure with one growth of the same waveguide material. As such, an optical coupler of the present invention may be operated with no bias for normal passive operation or with reverse bias for operating as an active device. Such a technique is discussed generally in U.S. Pat. No. 5,953,479, issued to Zhou et al. on Sep. 14, 1999, which is herein incorporated by reference in its entirety.

In an experiment, the passive waveguide was confined with a low effective index contrast, $\Delta_n$, of 0.86%, while the active waveguide had a high $\Delta_n$ of 3.4%. Having a width of 6 um, the active waveguide supports seven (7) modes with a beating length, $L_\pi$, of 91 um for symmetric excitation of an input optical signal. As such, the first-order 1×2 MMI coupler has a length of 45.5 um. For an input passive waveguide of 1.8 um wide, more than 96% of input power can be coupled into the active MMI section. The majority of the power loss is due to a slight vertical offset between the active mode and the passive mode.

Since tuning the bias current changes both the amplitude and the phase of the optical field in each MMI supported mode, the splitting ratio is expected also to be adjustable. In the extreme case, this would allow a fast switching of an input optical signal between two output waveguides.

While the forgoing is directed to various embodiments of the present invention, other and further embodiments of the invention may be devised without departing from the basic scope thereof. As such, the appropriate scope of the invention is to be determined according to the claims, which follow.

What is claimed is:

1. An optical coupler, comprising:
    at least one input waveguide coupled to at least two output waveguides via an optical splitter;
    wherein said optical splitter includes an active layer adapted to provide contemporaneous splitting and amplification of an input optical signal,
    wherein a bias current is applied to said active layer, and
    wherein a splitting ratio of said optical coupler is adjustable within a range by tuning said active layer bias current.

2. The optical coupler of claim 1, wherein each component of said split input optical signal at each of the output waveguides comprises substantially the same optical power as said input optical signal.

3. The optical coupler of claim 1, wherein said optical splitter comprises a channel waveguide structure including a slab layer, an index-loading rib layer and said active layer.

4. The optical coupler of claim 1, wherein said optical splitter comprises an MMI coupler.

5. The optical coupler of claim 1, wherein said optical splitter comprises a free space optical coupler.

6. The optical coupler of claim 5, wherein said free space optical coupler comprises a star coupler.

7. The optical coupler of claim 1, wherein said optical coupler is integrated using planar waveguide technology.

8. A method for lossless optical coupling, comprising:
    contemporaneously splitting and amplifying an input optical signal at an active layer such that each component of said split optical signal comprises substantially the same optical power as said input optical signal; and
    adjusting a splitting ratio of said splitting within a range by tuning a bias current of the active layer implemented to achieve said amplifying.

9. The method of claim 8, wherein said splitting and amplifying occur at substantially the same location.

10. An optical coupler, comprising:
    at least one input means coupled to at least two output means via an optical splitting means;
    wherein said splitting means includes an active layer adapted to provide contemporaneous splitting and amplification of an input optical,
    wherein a bias current is applied to said active layer, and
    wherein a splitting ratio of said optical coupler is adjustable within a range by tuning said active layer bias current.

11. The optical coupler of claim 10, wherein each component of said split input optical signal at each of the output means comprises substantially the same optical power as said input optical signal.

12. The optical coupler of claim 10, wherein said optical splitter comprises a channel waveguide structure including a slab layer, an index-loading rib layer and said active layer.

13. The optical coupler of claim 10, wherein said optical coupler is integrated using planar waveguide technology.

14. The optical coupler of claim 10, wherein said splitting means comprises an MMI coupler.

15. The optical coupler of claim 10, wherein said splitting means comprises a free space optical coupler.

* * * * *